US012765397B2

(12) United States Patent
Kubota et al.

(10) Patent No.: US 12,765,397 B2
(45) Date of Patent: Oct. 13, 2026

(54) ELECTRONIC COMPONENT HAVING A SUSPENSION TERMINAL EXTENDING FROM A DIE PAD AND A DUMMY TERMINAL

(71) Applicant: KOA CORPORATION, Nagano (JP)

(72) Inventors: Hirofumi Kubota, Nagano (JP); Tomonori Oguchi, Nagano (JP)

(73) Assignee: KOA CORPORATION, Nagano (JP)

( * ) Notice: Subject to any disclaimer, the term of this patent is extended or adjusted under 35 U.S.C. 154(b) by 411 days.

(21) Appl. No.: 18/371,150

(22) Filed: Sep. 21, 2023

(65) Prior Publication Data

US 2024/0105559 A1 Mar. 28, 2024

(30) Foreign Application Priority Data

Sep. 28, 2022 (JP) ................................. 2022-154303

(51) Int. Cl.

*H10W 70/40* (2026.01)
*H10W 74/00* (2026.01)
*H10W 90/00* (2026.01)

(52) U.S. Cl.

CPC ....... *H10W 70/421* (2026.01); *H10W 70/415* (2026.01); *H10W 74/00* (2026.01); *H10W 90/756* (2026.01)

(58) Field of Classification Search

CPC ............. H01L 23/495; H01L 23/49503; H01L 23/4951; H01L 23/49517; H01L 23/49541; H01L 23/49551; H01L 23/49555; H01L 23/49575; H01L 24/07; H01L 24/08; H01L 24/09; H01L 24/47; H01L 24/48; H01L 24/49; H01L 2224/48245; H01L 2924/182; H10W 70/411; H10W 70/415; H10W 70/421; H10W 72/50; H10W 72/521; H10W 74/00; H10W 90/756

See application file for complete search history.

(56) References Cited

U.S. PATENT DOCUMENTS

2009/0283883 A1* 11/2009 Igarashi ................ H01L 23/495 257/676
2015/0380342 A1* 12/2015 Kashiwazaki .......... H01L 24/85 438/123
2019/0198203 A1 6/2019 Kanegae et al.

FOREIGN PATENT DOCUMENTS

| | | |
|---|---|---|
| JP | 6-252326 | 9/1994 |
| JP | 2-244734 | 9/1999 |
| JP | 2000-307049 | 11/2000 |
| JP | 2002-305267 | 10/2002 |
| JP | 2013-128040 | 6/2013 |
| JP | 6938118 | 9/2021 |

* cited by examiner

*Primary Examiner* — Cheung Lee
(74) *Attorney, Agent, or Firm* — GREENBLUM & BERNSTEIN, P.L.C.

(57) ABSTRACT

An electronic component according to an embodiment of the present invention includes: a chip; a die pad to which the chip is secured; a suspension terminal extending from the die pad; a lead terminal electrically connected to the chip; and a dummy terminal, in which the suspension terminal is disposed closer to the dummy terminal than the lead terminal.

5 Claims, 2 Drawing Sheets

ELECTRONIC COMPONENT HAVING A SUSPENSION TERMINAL EXTENDING FROM A DIE PAD AND A DUMMY TERMINAL

BACKGROUND OF THE INVENTION

1. Technical Field

The present invention relates to an electronic component including a die pad and a suspension terminal extending from the die pad.

2. Description of the Related Art

The invention disclosed in JP 6938118 B2 relates to an electronic component including a chip, a die pad to which the chip is secured, a suspension terminal extending from the die pad, and a lead terminal electrically connected to the chip, in which the suspension terminal has an exposed face that is exposed from a molded resin and is covered with an electrically insulating layer.

Because the lead terminal electrically connected to the chip is disposed near the suspension terminal, in order to prevent a tracking phenomenon from occurring between the lead terminal and the suspension terminal at the time of application of high voltage, the suspension terminal has its exposed face covered with the electrically insulating layer.

An object of the present invention is to provide an electronic component including a suspension terminal having an exposed face covered with no electrically insulating layer and enabling inhibition of a tracking phenomenon.

SUMMARY OF THE INVENTION

An electronic component according to an embodiment of the present invention includes: a chip; a die pad to which the chip is secured; a suspension terminal extending from the die pad; a lead terminal electrically connected to the chip; and a dummy terminal, in which the suspension terminal is disposed closer to the dummy terminal than the lead terminal.

An electronic component according to an embodiment of the present invention includes: a chip; a die pad to which the chip is secured; a suspension terminal extending from the die pad; a lead terminal electrically connected to the chip; and a dummy terminal, in which the suspension terminal serves as the dummy terminal.

According to each of the above embodiments of the present invention, based on a first diagonal and a second diagonal intersecting on a surface of the die pad, preferably, the suspension terminal extends from near an end portion of the die pad intersecting the first diagonal, and the lead terminal is disposed near an end portion of the die pad intersecting the second diagonal.

According to an embodiment of the present invention, a tracking phenomenon can be inhibited with a suspension terminal having an exposed face covered with no insulating resin because of a longer distance between the suspension terminal and a lead terminal.

DETAILED DESCRIPTION

Modes for carrying out the present invention (hereinafter, simply referred to as embodiments) will be described in detail below. Note that the present invention is not limited to the following embodiments and thus various modifications can be made without departing from the gist of the present invention.

<Insulation Measure for Conventional Electronic Component 21>

Figure 1:
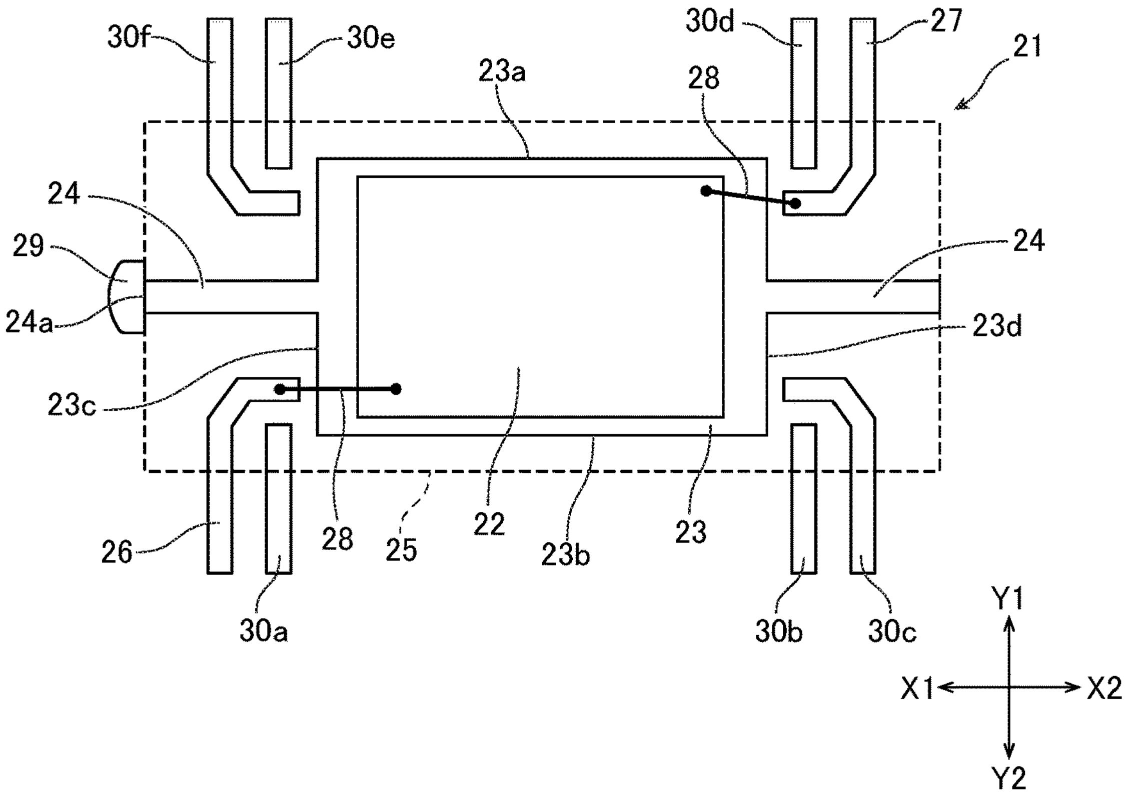
FIG. 1 is a plan view of an electronic component in a conventional example.

FIG. 1 is a plan view of an electronic component 21 in a conventional example. As illustrated in FIG. 1, a die pad 23 to which a chip 22 is secured has a pair of suspension terminals 24. The die pad 23 is rectangular in shape in plan view with four sides among which two sides are along an X1-X2 direction and the other two sides are along a Y1-Y2 direction, the X1-X2 direction and the Y1-Y2 direction being orthogonal to each other. The die pad 23 has a Y1-side end face 23*a*, a Y2-side end face 23*b*, an X1-side end face 23*c*, and an X2-side end face 23*d*. As illustrated in FIG. 1, one of the suspension terminals 24 extends from the center of the X1-side end face 23*c* of the die pad 23 and the other extends from the center of the X2-side end face 23*d* of the die pad 23.

In a lead frame, the suspension terminals 24 each serve as a beam member that keeps the die pad 23 coupled with the outer frame of the lead frame. After wire bonding and resin sealing, any redundant portion is removed from the lead frame, but the suspension terminals 24 are kept as part. Thus, the suspension terminals 24 each have an end face 24*a* that is an exposed face exposed from an end face of a sealing resin 25 after removal of any redundant portion from the lead frame. Note that, referring to FIG. 1, the sealing resin 25 is indicated with a dotted line. That is, although the region inside the dotted line is invisible from outside because of the coating with the sealing resin 25, the present figure is provided as a see-through view.

As illustrated in FIG. 1, lead terminals 26 and 27 are each electrically connected to the chip 22 through a wire 28. The lead terminal 26 is provided near the Y2 side of the X1-side end face 23*c* of the die pad 23, and the lead terminal 27 is provided near the Y1 side of the X2-side end face 23*d* of the die pad 23. Dummy terminals 30*a* to 30*f* are provided.

In the conventional example in FIG. 1, the exposed face 24*a* of one of the suspension terminals 24 and the lead terminal 26 are close in distance. Thus, in response to application of high voltage, a tracking phenomenon occurs between the exposed face 24*a* of the one of the suspension terminals 24 and the lead terminal 26. As above, according to the structure of the conventional electronic component 21, as a problem, discharge occurs through a suspension terminal 24. Thus, as illustrated in FIG. 1, with a longer creepage distance due to an electrically insulating layer 29 with which the exposed face 24*a* of each suspension terminal 24 is provided, a tracking phenomenon is inhibited from occurring.

However, the conventional example of FIG. 1 needs addition of such electrically insulating layers 29. Thus, desired is a structure enabling prevention of a tracking phenomenon with no electrically insulating layer 29.

<Electronic Component 1 in First Embodiment>

Figure 2:
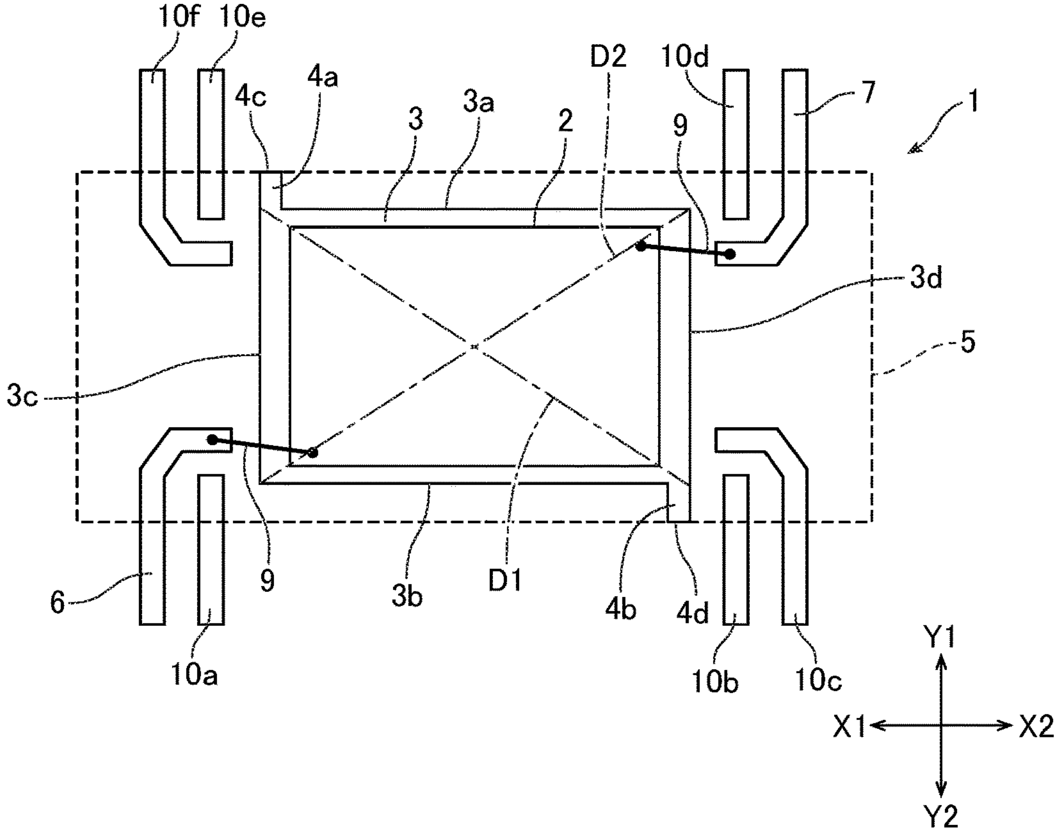
FIG. 2 is a plan view of an electronic component in a first embodiment.

FIG. 2 is a plan view of an electronic component 1 in a first embodiment. Like FIG. 1, given is a see-through view with a sealing resin 5 indicated with a dotted line.

The electronic component 1 illustrated in FIG. 2 includes a chip 2, a die pad 3 to which the chip 2 is secured, suspension terminals 4*a* and 4*b* extending from the die pad 3, lead terminals 6 and 7 electrically connected to the chip 2, and dummy terminals 10*a* to 10*f*.

For example, the die pad 3, the suspension terminals 4*a* and 4*b*, the lead terminals 6 and 7, and the dummy terminals 10*a* to 10*f* are individually separated due to removal of any redundant portion from a lead frame made of a thin plate of copper or cooper alloy. Note that the die pad 3 and the suspension terminals 4*a* and 4*b* are integrated together.

As illustrated in FIG. 2, two directions orthogonal in plan view are defined as an X1-X2 direction and a Y1-Y2 direction. The die pad 3 is rectangular in shape with a Y1-side end face 3*a* and a Y2-side end face 3*b* along the X1-X2 direction and an X1-side end face 3*c* and an X2-side end face 3*d* along the Y1-Y2 direction. As illustrated in FIG. 2, for example, the die pad 3 is oblong in shape, in which the Y1-side end face 3*a* and the Y2-side end face 3*b* are longer than the X1-side end face 3*c* and the X2-side end face 3*d*.

As illustrated in FIG. 2, the suspension terminal 4*a* as a first suspension terminal extends integrally from the die pad 3 near the end portion on the X1 side of the Y1-side end face 3*a* of the die pad 3, and the suspension terminal 4*b* as a second suspension terminal extends integrally from the die pad 3 near the end portion on the X2 side of the Y2-side end face 3*b* of the die pad 3. The suspension terminals 4*a* and 4*b* have, respectively, end faces 4*c* and 4*d* that are cut faces resulting from cutting of any redundant portion from the lead frame, namely, exposed faces exposed from the sealing resin 5. The respective end faces 4*c* and 4*d* of the suspension terminals 4*a* and 4*b* are covered with no electrically insulating layer, differently from the conventional example of FIG. 1.

As illustrated in FIG. 2, the die pad 3 has a surface on which the chip 2 rectangular in shape, similarly to the die pad 3, is mounted. Note that the shape of the chip 2 in plan view is not limited. For example, the chip 2 includes a thin-film-resistor integrated array. A semiconductor silicon chip is used as the chip 2. Note that the chip 2 is not limited to any semiconductor chip and thus may be a ceramic chip. The chip 2 is electrically connected to each of the lead terminals 6 and 7 through a wire 9.

As illustrated in FIG. 2, the lead terminal 6 as a first lead terminal is located near the Y2 side of the X1-side end face 3*c* of the die pad 3, and the lead terminal 7 as a second lead terminal is located near the Y1 side of the X2-side end face 3*d* of the die pad 3. That is, the lead terminals 6 and 7 are disposed substantially on a diagonal of the die pad 3, and a voltage is applied across the lead terminals 6 and 7 disposed diagonally.

The dummy terminals 10*a* to 10*f* and the lead terminals 6 and 7 are disposed symmetrically with respect to a line along the X1-X2 direction and a line along the Y1-Y2 direction that pass through the center of the die pad 3, near the four corners of the die pad 3. The dummy terminals 10*a* to 10*f* and the lead terminals 6 and 7 each protrude outward from an end face of the sealing resin 5.

Distances between the suspension terminals 4*a* and 4*b* and the lead terminals 6 and 7 will be described. In comparison between the first embodiment in FIG. 2 and the conventional example in FIG. 1, the lead terminals and the dummy terminals to the die pad 3 are identical in position to the lead terminals and the dummy terminals to the die pad 23, but the suspension terminals 4*a* and 4*b* are different in position from the suspension terminals 24. As illustrated in FIGS. 1 and 2, the die pads 3 and 23 are each oblong in shape in which the length in the X1-X2 direction is longer than the length in the Y1-Y2 direction. In the conventional example of FIG. 1, the suspension terminals 24 extend one-to-one from the centers of the X1-side end face 23*c* and the X2-side end face 23*d* as the shorter end faces of the die pad 23. In contrast, in the first embodiment in FIG. 2, the suspension terminal 4*a* extends from near an end portion opposite to the end portion closer to the lead terminal 7 on the Y1-side end face 3*a* as a longer end face of the die pad 3, and the suspension terminal 4*b* extends from near an end portion opposite to the end portion closer to the lead terminal 6 on the Y2-side end face 3*b* as the other longer end face of the die pad 3. Thus, the distance between the suspension terminal 4*a* and the lead terminal 6 and the distance between the suspension terminal 4*b* and the lead terminal 7 in the first embodiment are each longer than the distance between the lead terminal 26 and the suspension terminal 24 closer to the lead terminal 26 and the distance between the lead terminal 27 and the suspension terminal 24 closer to the lead terminal 27 in the conventional example. In the present embodiment as above, the suspension terminals 4*a* and 4*b* are each located away from the lead terminals 6 and 7. Therefore, differently from the conventional example in FIG. 1, the present embodiment enables a longer creepage distance even with the suspension terminals 4*a* and 4*b* having the respective exposed faces 4*c* and 4*d* covered with no electrically insulating layer, leading to effective inhibition of a tracking phenomenon.

Distinctive configurations of the electronic component 1 in the present embodiment are as follows:

(1) The suspension terminals 4*a* and 4*b* are disposed closer to the dummy terminals 10*e* and 10*b* than the lead terminals 6 and 7, respectively. That is, forming the suspension terminals 4*a* and 4*b* closer to the dummy terminals 10*e* and 10*b* enables increases in the distances from the lead terminals 6 and 7, respectively. The respective positions of the suspension terminals 4*a* and 4*b*, the lead terminals 6 and 7, and the dummy terminals 10*e* and 10*b* may be different from the arrangement of FIG. 2, provided that the relationship in (1) is fulfilled. However, as illustrated in FIG. 2, preferably, adopted is a structure in which the lead terminals 6 and 7 and the dummy terminals 10*e* and 10*b* are separately disposed one-to-one near the four corners of the die pad 3. Thus, making the suspension terminals 4*a* and 4*b* disposed near the dummy terminals 10*e* and 10*b*, respectively, enables an effective increase in the distance between the suspension terminal 4*a* and the lead terminal 6 and an effective increase in the distance between the suspension terminal 4*b* and the lead terminal 7. Alternatively, the suspension terminals 4*a* and 4*b* are disposed, respectively, near the dummy terminals 10*b* and 10*e* away from the lead terminals 6 and 7 among the dummy terminals 10*a* to 10*f*.

(2) As illustrated in FIG. 2, based on two diagonals D1 and D2 intersecting on the surface of the die pad 3, the suspension terminals 4*a* and 4*b* are disposed one-to-one near the end portions (corner portions) of the die pad 3 intersecting the diagonal D1 as a first diagonal, and the lead terminals 6 and 7 are disposed one-to-one near the end portions (corner portions) of the die pad 3 intersecting the diagonal D2 as a second diagonal.

In particular, as illustrated in FIG. 2, since the die pad 3 is oblong in shape in which the length in the X1-X2 direction is longer than the length in the Y1-Y2 direction, preferably, the suspension terminal 4*a* and the lead terminal 6 are disposed on one side in the X1-X2 direction of the die pad 3 and the suspension terminal 4*b* and the lead terminal 7 are disposed on the other side. Thus, the distance between the suspension terminal 4*a* and the lead terminal 7 and the distance between the suspension terminal 4*b* and the lead terminal 6 can be effectively lengthened.

<Electronic Component 11 in Second Embodiment>

Figure 3:
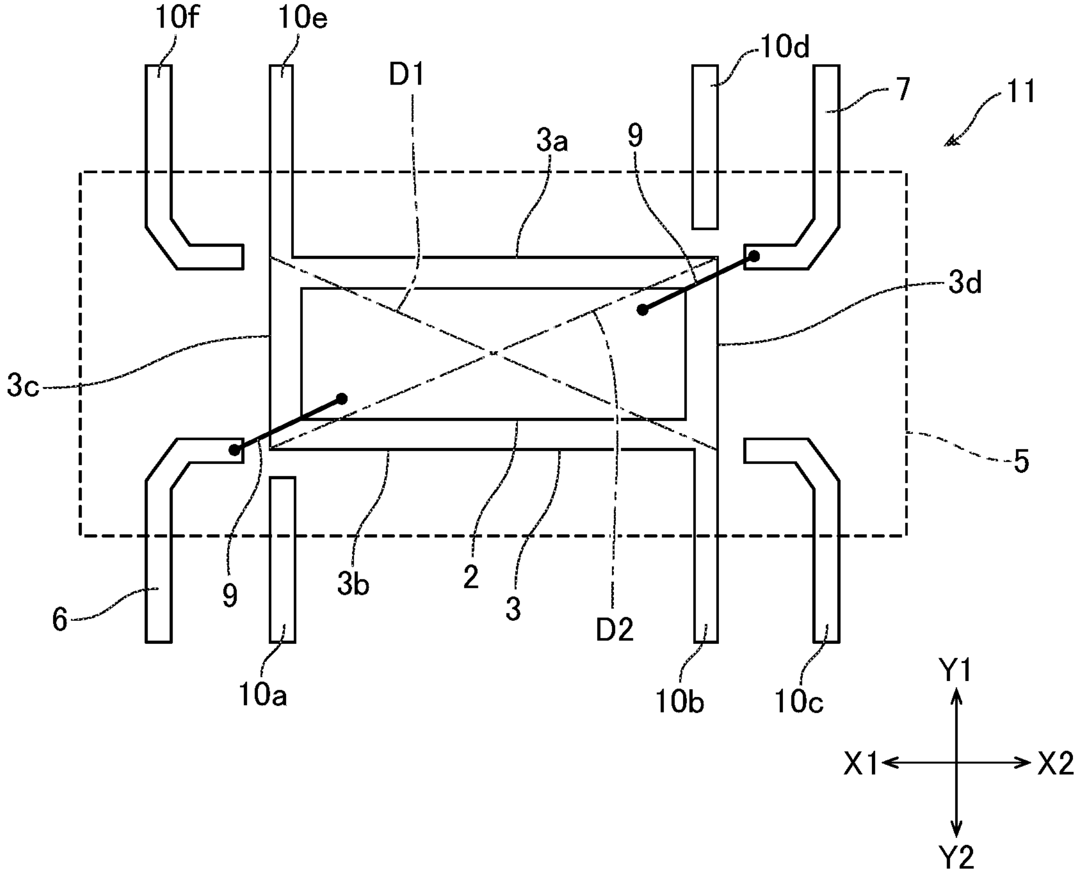
FIG. 3 is a plan view of an electronic component in a second embodiment.

FIG. 3 is a plan view of an electronic component 11 in a second embodiment. Like FIGS. 1 and 2, given is a see-through view with a sealing resin 5 indicated with a dotted line.

The electronic component 11 illustrated in FIG. 3 includes a chip 2, a die pad 3 to which the chip 2 is secured, lead terminals 6 and 7 electrically connected to the chip 2, and dummy terminals 10*a* to 10*f*. Note that the same reference signs in FIGS. 2 and 3 indicate the same members in FIGS. 2 and 3.

In the second embodiment in FIG. 3, the lead terminals 6 and 7 and the dummy terminals 10*a* to 10*f* are disposed at the four corners of the die pad 3. The dummy terminals 10*b* and 10*e* among the dummy terminals 10*a* to 10*f* serve as suspension terminals. Hereinafter, the dummy terminals 10*b* and 10*e* are referred to as suspension terminals 10*b* and 10*e*, respectively.

That is, in the present embodiment, in a lead frame, the die pad 3 and the outer frame of the lead frame are coupled through the suspension terminals 10*b* and 10*e*, and the suspension terminals 10*b* and 10*e* are kept as dummy terminals after removal of the outer frame as a redundant portion. Thus, as illustrated in FIG. 3, the suspension terminals 10*b* and 10*e* each protrude outward from the sealing resin 5 as an external terminal structure.

Since the suspension terminals 10*b* and 10*e* serve as dummy terminals, the total number of terminals is less in the second embodiment in FIG. 3 than in the first embodiment in FIG. 2. In order to retain the arrangement balance between the terminals, the dummy terminals 10*d* and 10*a* are disposed, respectively, opposite the suspension terminals 10*b* and 10*e* in the Y1-Y2 direction.

In the second embodiment, the suspension terminals 10*b* and 10*e* serve, respectively, as dummy terminals away from the lead terminals 6 and 7 among the dummy terminals, leading to a longer distance between the suspension terminal 10*b* and the lead terminal 6 and a longer distance between the suspension terminal 10*e* and the lead terminal 7.

As illustrated in FIG. 3, the die pad 3 is oblong in shape in which the length in the X1-X2 direction is longer than the length in the Y1-Y2 direction. That is, the die pad 3 has a Y1-side end face 3*a*, a Y2-side end face 3*b*, an X1-side end face 3*c*, and an X2-side end face 3*d*, in which the Y1-side end face 3*a* and the Y2-side end face 3*b* are longer than the X1-side end face 3*c* and the X2-side end face 3*d*.

Then, the suspension terminal 10*e* and the lead terminal 7 are disposed on the side of location of the Y1-side end face 3*a* longer in length and the suspension terminal 10*b* and the lead terminal 6 are disposed on the side of location of the Y2-side end face 3*b* longer in length, leading to a more effective long distance between the suspension terminal 10*b* and the lead terminal 7 and a more effective long distance between the suspension terminal 10*e* and the lead terminal 6. As illustrated in FIG. 3, based on two diagonals D1 and D2 intersecting on the surface of the die pad 3, preferably, the suspension terminals 10*b* and 10*e* are disposed one-to-one near the end portions (corner portions) of the die pad 3 intersecting the diagonal D1 as a first diagonal, and the lead terminals 6 and 7 are disposed one-to-one near the end portions (corner portions) of the die pad 3 intersecting the diagonal D2 as a second diagonal, leading to an effective longer distance between the suspension terminal 10*b* and the lead terminal 6 and an effective long distance between the suspension terminal 10*e* and the lead terminal 7.

Note that the respective numbers of dummy terminals in the first and second embodiments in FIGS. 2 and 3 are exemplary and thus are not limitative in the number of terminals.

An electronic component according to an embodiment of the present invention enables inhibition of a tracking phenomenon and has a long life even under the condition of application of high voltage. For example, the electronic component can be applied to a thin-film resistor network.

What is claimed is:

1. An electronic component comprising:
- a chip;
- a die pad to which the chip is secured;
- a suspension terminal extending from the die pad;
- a plurality of lead terminals that are electrically connected to the chip; and
- a dummy terminal,
- wherein the suspension terminal is disposed closer to the dummy terminal than any of the plurality of lead terminals.

2. The electronic component according to claim 1, wherein, based on a first diagonal and a second diagonal intersecting on a surface of the die pad, the suspension terminal extends from near an end portion of the die pad intersecting the first diagonal, and each of the plurality of lead terminals is disposed near a corresponding end portion of the die pad that intersects the second diagonal.

3. The electronic component according to claim 1,
- wherein the suspension terminal is a plurality of suspension terminals,
- wherein the dummy terminal is a plurality of dummy terminals,
- wherein each one of suspension terminals is disposed closer to a corresponding one of the dummy terminals than a corresponding one of the lead terminals.

4. An electronic component comprising:
- a chip;
- a die pad to which the chip is secured;
- a suspension terminal extending from the die pad;
- a lead terminal electrically connected to the chip; and
- a dummy terminal,
- wherein the dummy terminal includes: (i) a first dummy terminal that also serves as the suspension terminal, and (ii) a second dummy terminal separated from the die pad.

5. The electronic component according to claim 4, wherein, based on a first diagonal and a second diagonal intersecting on a surface of the die pad, the suspension terminal extends from near an end portion of the die pad intersecting the first diagonal, and the lead terminal is disposed near an end portion of the die pad intersecting the second diagonal.

* * * * *